United States Patent [19]

Adachi et al.

[11] Patent Number: 5,279,922
[45] Date of Patent: Jan. 18, 1994

[54] LIGHT-SENSITIVE COATING LIQUID

[75] Inventors: Yutaka Adachi; Kiyoshi Goto; Koji Fukazawa, all of Hinoo; Kunitaka Naito; Masaaki Tsuchiyama, both of Hasakimachi, all of Japan

[73] Assignees: Konica Corporation; Mitsubishi Kasei Corporation, both of Tokyo, Japan

[21] Appl. No.: 844,930

[22] Filed: Mar. 4, 1992

Related U.S. Application Data

[63] Continuation of Ser. No. 563,203, Aug. 6, 1990, abandoned.

[30] Foreign Application Priority Data

Aug. 7, 1989 [JP] Japan .................... 1-202931
Apr. 6, 1990 [JP] Japan .................... 2-91878

[51] Int. Cl.$^5$ ............................. G03C 1/492
[52] U.S. Cl. .................... 430/270; 430/175; 430/191; 430/193
[58] Field of Search ............. 430/270, 175, 191, 193

[56] References Cited

U.S. PATENT DOCUMENTS

| | | | |
|---|---|---|---|
| 4,803,145 | 2/1989 | Suzuki et al. | 430/166 |
| 4,822,713 | 4/1989 | Nishioka et al. | 430/270 |
| 4,963,611 | 10/1990 | Nagasawa . | |
| 4,971,887 | 11/1990 | Schmitt et al. | 430/191 |

FOREIGN PATENT DOCUMENTS

| | | |
|---|---|---|
| 230995 | 8/1987 | European Pat. Off. . |
| 239082 | 9/1987 | European Pat. Off. . |
| 3215112 | 11/1982 | Fed. Rep. of Germany . |

*Primary Examiner*—Marion E. McCamish
*Assistant Examiner*—Mark A. Chapman
*Attorney, Agent, or Firm*—Finnegan, Henderson, Farabow, Garrett & Dunner

[57] ABSTRACT

A light-sensitive coating liquid, comprising, as an organic solvent, at least one substance represented by the formulae (I) to (III) shown below:

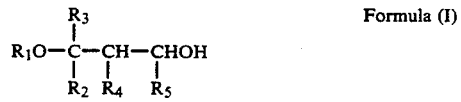

Formula (I)

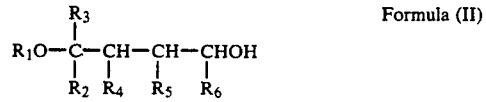

Formula (II)

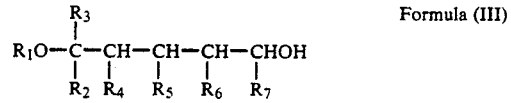

Formula (III)

wherein $R_1$ represents an alkyl group having 1 to 4 carbon atoms, $R_2$ to $R_7$ each represent hydrogen atom or an alkyl group having 1 to 3 carbon atoms, with the proviso that at least one of $R_2$ to $R_7$ is an alkyl group. The light-sensitive coating liquid of this invention is improved in odor, low in toxicity and yet excellent in storability, and is also suitable for preparation of a light-sensitive lithographic printing plate improved in press life and dye remaining.

9 Claims, No Drawings

LIGHT-SENSITIVE COATING LIQUID

This application is a continuation of application Ser. No. 07/563,203, filed Aug. 6, 1990, now abandoned.

BACKGROUND OF THE INVENTION

This invention relates to a light-sensitive coating solution, more particularly to a light-sensitive coating solution, which gives a light-sensitive liquid improved in odor, low in toxicity and yet excellent in storability, and is also suitable for preparation of a light-sensitive lithographic printing plate improved in press life and dye remaining.

A light-sensitive lithographic printing plate is prepared by dissolving a light-sensitive composition in an appropriate solvent, coating the solution onto a support and drying the coating. In the prior art, during preparation of such light-sensitive lithographic printing plate, as the solvent for dissolving the light-sensitive composition, various solvents have been employed. For example, glycol ethers such as methyl cellosolve (ethylene glycol monomethyl ether), ethyl cellosolve, etc. have been primarily employed.

However, these coating solvents have the problem of strong toxicity during preparation of light-sensitive printing plates, and also have strong odor, with unpleasant feeling as undesirable in working environment. Further, when a light-sensitive composition is coated onto a support by use of a solvent as mentioned above, coatability is poor, generating frequently coating irregularity such as streak irregularity, pinhole, etc., thus involving a problem such that the value as commercial product may be impaired.

Use of a propylene glycol type compound as the solvent for light-sensitive coating liquid is disclosed in Japanese Unexamined Patent Publications Nos. 6648/1986, 14652/1987, etc., but the light-sensitive printing plate obtained by use of such propylene glycol type compound is poor in storability and improvement of this point has been desired.

Further, ester compounds of propylene glycols, etc. used as the coating solvent are improved in odor, toxicity and coatability as compared with the solvents of the prior art such as methyl cellosolve, ethyl cellosolve, etc., but they cannot be said to be satisfactory. For example, 3-methoxybutyl acetate as described in Japanese Unexamined Patent Publication No. 5237/1987, propylene glycol monoalkyl ether acetate in Japanese Unexamined Patent Publication No. 7837/1986 are improved in odor and toxicity, but not only storability of the light-sensitive coating liquid is impaired, but also said compound undergoes hydrolysis because of having acetate structure through the influence by the moisture mixed as the impurity into the light-sensitive liquid or absorption of the moisture in the air, whereby acetic acid is liberated. Due to the liberated acetic acid, drawbacks are seen such that dye remaining is generated on the printing plate after development, and that the press life of the light-sensitive lithographic plate is inferior. Here, dye remaining refers to the phenomenon that, when an image is developed after exposure, the organic dye contained in the light-sensitive composition is attached onto the non-image and streak portion of the printing plate obtained to color the plate. The dye remaining cause problems of difficulty in identification of the image and streak portion from the non-image and streak portion and lowering of layout proof property.

SUMMARY OF THE INVENTION

Accordingly, the present inventors have made various investigations and consequently found that the problems in the light-sensitive liquid as well as press life of the light-sensitive lithographic printing plate prepared by use of said organic solvent, can be markedly improved by use of a certain kind of organic solvent, to accomplish the present invention.

A first object of the present invention is to provide a light-sensitive coating liquid which is improved in odor, low in toxicity, and yet excellent in storability of light-sensitive liquid.

A second object of the present invention is to provide a light-sensitive coating liquid which is good in layout proof property due to absence of dye remaining, and also improved in press life and staining.

The various objects of the present invention as mentioned above can be accomplished by a light-sensitive coating liquid comprising at least one of the substances shown below by the formulae (I) to (III):

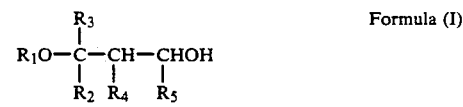

Formula (I)

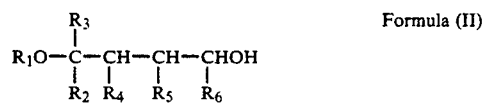

Formula (II)

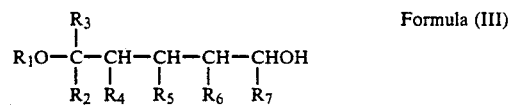

Formula (III)

wherein $R_1$ represents an alkyl group having 1 to 4 carbon atoms, $R_2$ to $R_7$ each represent hydrogen atom or an alkyl group having 1 to 3 carbon atoms, with the proviso that at least one of $R_2$ to $R_7$ is an alkyl group.

DESCRIPTION OF THE PREFERRED EMBODIMENTS

The light-sensitive coating liquid containing the substances represented by the formulae (I) to (III) to be used in the present invention are improved in toxicity and odor in the coating step of the light-sensitive coating liquid as well as in storability of the light-sensitive liquid and also the light-sensitive lithographic printing plate prepared by using the liquid is free from dye remaining and also excellent in press life.

In the formulae (I) to (III), $R_1$ is methyl, ethyl, n-propyl, isopropyl, n-butyl or isobutyl group, preferably methyl, ethyl or isopropyl group. $R_2$ to $R_7$ may include methyl, ethyl, n-propyl or isopropyl group.

In the substances represented by the formulae (I) to (III), those preferably employed may be the formulae (I) to (III) wherein at least one of $R_2$ and $R_3$ is methyl group, and $R_4$ to $R_7$ are hydrogen atoms. More preferably, $R_1$ and $R_2$ are methyl groups and $R_3$ is hydrogen atom.

The organic solvents represented by the formulae (I) to (III) can be used either individually or as a mixture of two or more kinds.

The organic solvent represented by the formula (I) to (III) to be used in the present invention may be used in an amount of 40% by weight to 100% by weight of the whole solvent, and at least one of them can be used in admixture.

As other solvents which can be used together with the organic solvents represented by the formulae (I) to (III), various substances generally employed can be used in combination and further can be conveniently mixed with two or more kinds of other solvents.

Specific examples of the substances represented by the formulae (I) to (III) to be used in the present invention are shown below, but the present invention is not limited thereto.

1) 3-Methoxy-1-butanol
2) 3-Methoxy-3-methyl-1-butanol
3) 3-Ethoxy-1-butanol
4) 3-Ethoxy-3-methoxy-1-butanol
5) 3-Isopropoxy-1-butanol
6) 3-Isopropoxy-3-methyl-1-butanol
7) 3-Methoxy-3-methyl-1-pentanol
8) 3-Methoxy-3-ethyl-1-pentanol
9) 4-Methoxy-1-pentanol
10) 4-Methoxy-4-methyl-1-pentanol
11) 4-Ethoxy-1-pentanol
12) 4-Methoxy-3-ethyl-1-hexanol
13) 5-Methoxy-1-hexanol
14) 5-Methoxy-5-methyl-1-hexanol
15) 5-Ethoxy-5-methyl-1-pentanol, and
16) 3-Methoxy-1,3-dimethyl-1-butanol.

As other solvents which may be used in combination with the substances represented by the formulae (I) to (III), there may be included alcohols such as methyl alcohol, ethyl alcohol, isopropyl alcohol, n-propyl alcohol, n-butanol, sec-butanol, isobutanol, t-butanol, 1-pentanol, 2-pentanol, 1-hexanol and the like; ketones such as methyl ethyl ketone, methyl n-propyl ketone, methyl isopropyl ketone, methyl n-butyl ketone, methyl isobutyl ketone and the like; diethylene glycols such as diethylene glycol monomethyl ether, diethylene glycol dimethyl ether, diethylene glycol monoethyl ether and the like; dimethylformamide, dimethyl sulfoxide, γ-butyrolactone, and water, etc. Among them, those preferably used are diethylene glycols as mentioned above.

Particularly, diethylene glycol monomethyl ether and diethylene glycol dimethyl ether are preferably used, more preferably diethylene glycol dimethyl ether should be contained at a ratio of 30% by weight to 60% by weight based on the total amount of the solvents.

In the present invention, fluorine type surfactants are preferably used as a component of the light-sensitive coating liquid. As the fluorine type surfactant, for example, (meth)acrylate polymers having fluorinated alkyl group in the side chain may be included, and in this case the number average molecular weight calculated on the standard polystyrene should be preferably 30,000 or less, more preferably within the range from 2,000 to 10,000. If the number average molecular weight exceeds 30,000, the effect of coatability improvement will not be sufficient.

The fluorine type surfactant to be used in the present invention is contained in an amount of 0.01 to 1% by weight, preferably 0.02 to 0.2% by weight, more preferably 0.025 to 0.1% by weight, based on the solids contained in the light-sensitive coating liquid.

The acrylate structural unit or the methacrylate structural unit at the moiety having the fluorinated alkyl group in the side chain of the above-mentioned (meth)acrylate polymer can be represented by, for example, the formula (IV) or the formula (V) shown below.

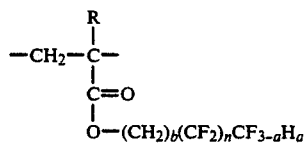

Formula (IV)

(wherein R is hydrogen atom or methyl group, n represents an integer of 0 to 20, a 0 to 2 and b 0 to 1).

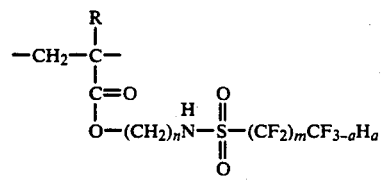

Formula (V)

(wherein R is hydrogen atom or methyl group, n represents an integer of 0 to 10, m 0 to 20 and a 0 to 2).

Structural units represented by the formula (IV) or (V) are specifically as shown below.

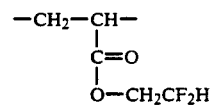

IV-1

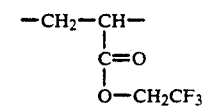

IV-2

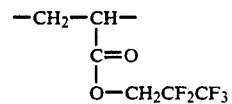

IV-3

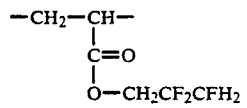

IV-4

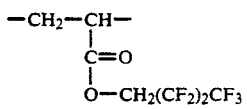

IV-5

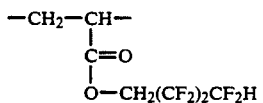

IV-6

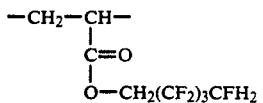

IV-7

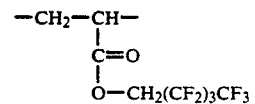

IV-8

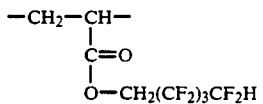

IV-9

| | | | | |
|---|---|---|---|---|
| $-CH_2-CH-$<br>$\quad\ \ \|$<br>$\quad\ \ C=O$<br>$\quad\ \ \|$<br>$\quad\ \ O-CH_2(CF_2)_3CFH_2$ | IV-10 | | $-CH_2-\underset{\underset{\underset{O-CH_2(CF_2)_4CF_3}{\|}}{\underset{C=O}{\|}}}{\overset{\overset{CH_3}{\|}}{C}}-$ | IV-23 |
| $-CH_2-CH-$<br>$\quad\ \ \|$<br>$\quad\ \ C=O$<br>$\quad\ \ \|$<br>$\quad\ \ O-CH_2(CF_2)_4CF_3$ | IV-11 | | $-CH_2-\underset{\underset{\underset{O-CH_2(CF_2)_4CF_2H}{\|}}{\underset{C=O}{\|}}}{\overset{\overset{CH_3}{\|}}{C}}-$ | IV-24 |
| $-CH_2-CH-$<br>$\quad\ \ \|$<br>$\quad\ \ C=O$<br>$\quad\ \ \|$<br>$\quad\ \ O-CH_2(CF_2)_4CF_2H$ | IV-12 | | $-CH_2-\underset{\underset{\underset{O-CH_2(CF_2)_6CF_3}{\|}}{\underset{C=O}{\|}}}{\overset{\overset{CH_3}{\|}}{C}}-$ | IV-25 |
| $-CH_2-CH-$<br>$\quad\ \ \|$<br>$\quad\ \ C=O$<br>$\quad\ \ \|$<br>$\quad\ \ O-CH_2(CF_2)_3CF_3$ | IV-13 | | $-CH_2-\underset{\underset{\underset{O-CH_2(CF_2)_6CFH_2}{\|}}{\underset{C=O}{\|}}}{\overset{\overset{CH_3}{\|}}{C}}-$ | IV-26 |
| $-CH_2-CH-$<br>$\quad\ \ \|$<br>$\quad\ \ C=O$<br>$\quad\ \ \|$<br>$\quad\ \ O-CH_2(CF_2)_3CF_2H$ | IV-14 | | $-CH_2-\underset{\underset{\underset{O-CH_2(CF_2)_8CF_3}{\|}}{\underset{C=O}{\|}}}{\overset{\overset{CH_3}{\|}}{C}}-$ | IV-27 |
| $-CH_2-CH-$<br>$\quad\ \ \|$<br>$\quad\ \ C=O$<br>$\quad\ \ \|$<br>$\quad\ \ O-CH_2(CF_2)_3CFH_2$ | IV-15 | | $-CH_2-\underset{\underset{\underset{O-CH_2(CF_2)_9CF_2H}{\|}}{\underset{C=O}{\|}}}{\overset{\overset{CH_3}{\|}}{C}}-$ | IV-28 |
| $-CH_2-CH-$<br>$\quad\ \ \|$<br>$\quad\ \ C=O$<br>$\quad\ \ \|$<br>$\quad\ \ O-CH_2(CF_2)_6CF_3$ | IV-16 | | $-CH_2-\underset{\underset{\underset{O-CH_2(CF_2)_{12}CF_3}{\|}}{\underset{C=O}{\|}}}{\overset{\overset{CH_3}{\|}}{C}}-$ | IV-29 |
| $-CH_2-CH-$<br>$\quad\ \ \|$<br>$\quad\ \ C=O$<br>$\quad\ \ \|$<br>$\quad\ \ O-CH_2(CF_2)_8CF_2H$ | IV-17 | | $-CH_2-\underset{\underset{\underset{O-CH_2(CF_2)_{12}CF_2H}{\|}}{\underset{C=O}{\|}}}{\overset{\overset{CH_3}{\|}}{C}}-$ | IV-30 |
| $-CH_2-CH-$<br>$\quad\ \ \|$<br>$\quad\ \ C=O$<br>$\quad\ \ \|$<br>$\quad\ \ O-CH_2(CF_2)_9CFH_2$ | IV-18 | | $-CH_2-\underset{\underset{\underset{O-CH_2(CF_2)_{15}CF_3}{\|}}{\underset{C=O}{\|}}}{\overset{\overset{CH_3}{\|}}{C}}-$ | IV-31 |
| $-CH_2-CH-$<br>$\quad\ \ \|$<br>$\quad\ \ C=O$<br>$\quad\ \ \|$<br>$\quad\ \ O-CH_2(CF_2)_{10}CF_3$ | IV-19 | | $-CH_2-\underset{\underset{\underset{O-CH_2(CF_2)_{18}CF_3}{\|}}{\underset{C=O}{\|}}}{\overset{\overset{CH_3}{\|}}{C}}-$ | IV-32 |
| $-CH_2-CH-$<br>$\quad\ \ \|$<br>$\quad\ \ C=O$<br>$\quad\ \ \|$<br>$\quad\ \ O-CH_2(CF_2)_{10}CF_2H$ | IV-20 | | $-CH_2-CH-$<br>$\quad\ \ \|$<br>$\quad\ \ C=O$<br>$\quad\ \ \|$<br>$\quad\ \ O-CF_2CF_3$ | IV-33 |
| $-CH_2-CH-$<br>$\quad\ \ \|$<br>$\quad\ \ C=O$<br>$\quad\ \ \|$<br>$\quad\ \ O-CH_2(CF_2)_{20}CF_3$ | IV-21 | | | |
| $-CH_2-CH-$<br>$\quad\ \ \|$<br>$\quad\ \ C=O$<br>$\quad\ \ \|$<br>$\quad\ \ O-CH_2(CF_2)_{20}CF_2H$ | IV-22 | | | |

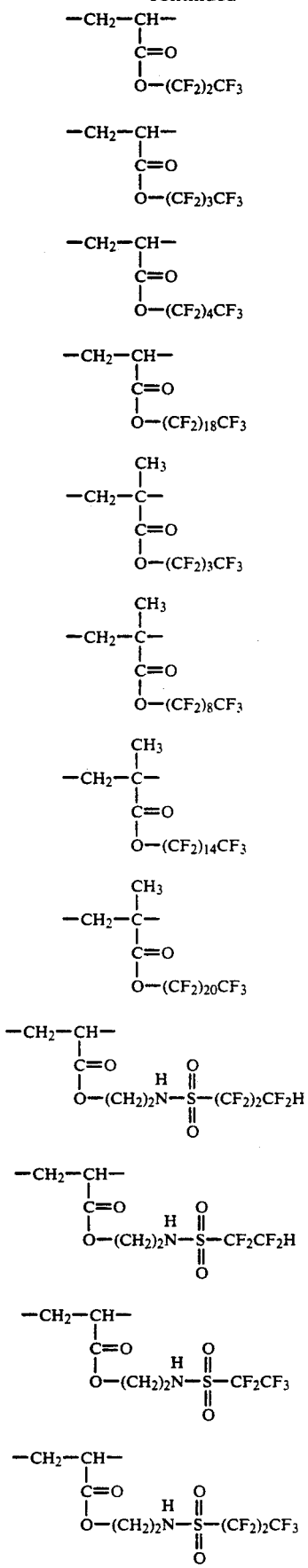
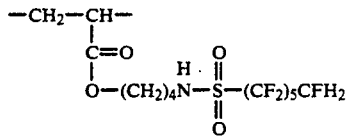
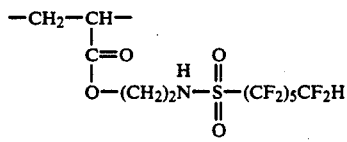
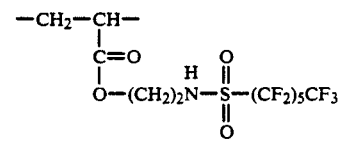
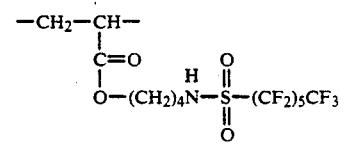
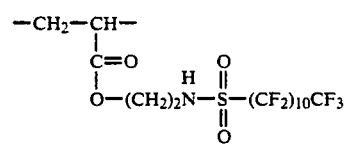
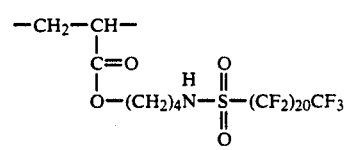
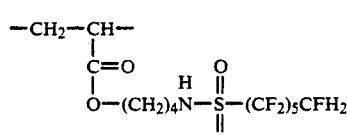
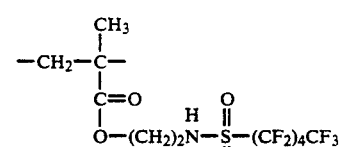
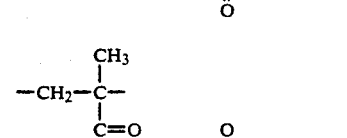
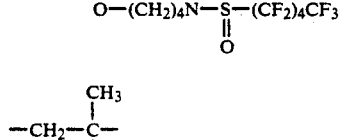

-continued

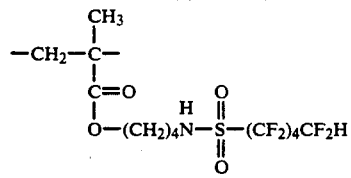 V-15

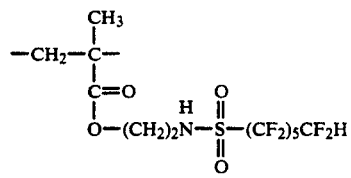 V-16

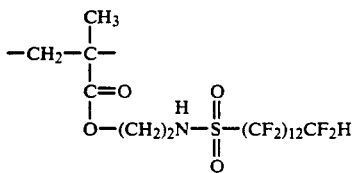 V-17

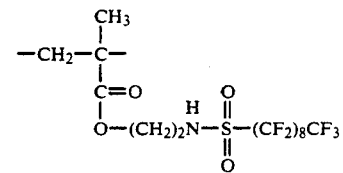 V-18

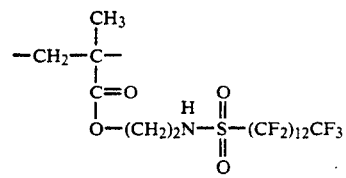 V-19

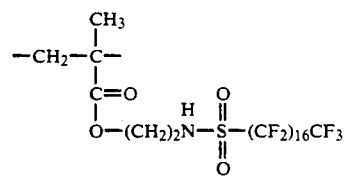 V-20

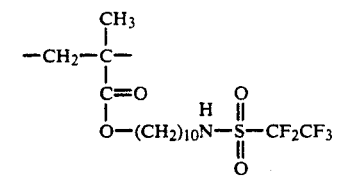 V-21

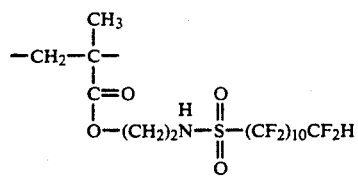 V-22

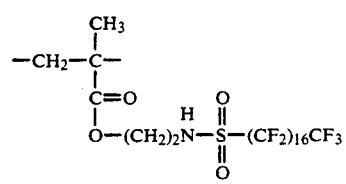 V-23

-continued

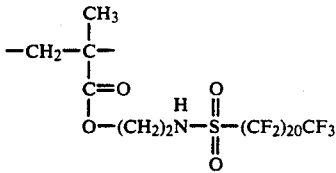 V-24

The (meth)acrylate polymers having the fluorinated alkyl group in the side chain should preferably have further an alkylene oxide group or an alkyl group in the side chain. The acrylate structural units or methacrylate structural units at the moiety having the alkylene oxide group in the (meth)acrylate polymers having fluorinated alkyl groups in the side chain are represented by the formula (VI) shown below.

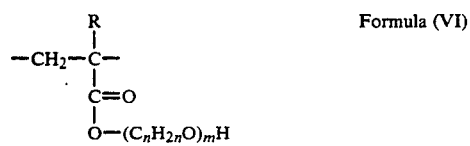

Formula (VI)

(wherein R represents hydrogen atom or methyl group, n represents an integer of 1 to 6, m 1 to 10).

The structural units represented by the formula (VI) are specifically shown below.

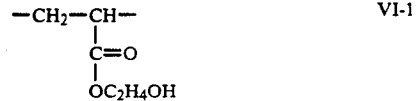 VI-1

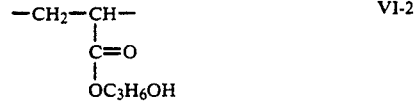 VI-2

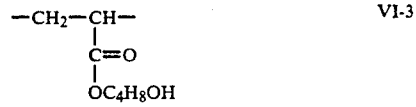 VI-3

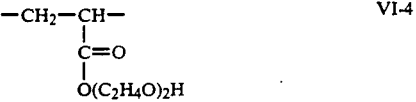 VI-4

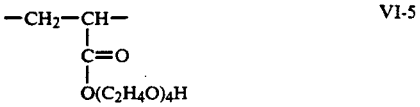 VI-5

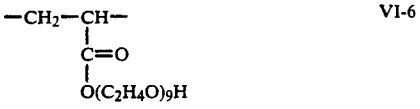 VI-6

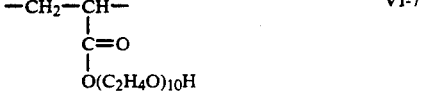 VI-7

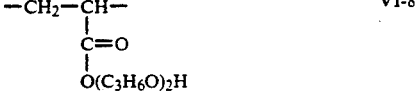 VI-8

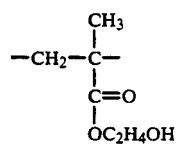 VI-9

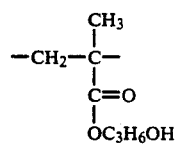 VI-10

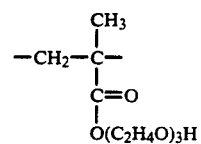 VI-11

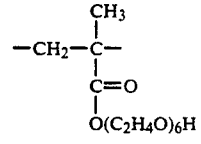 VI-12

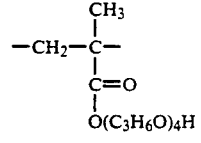 VI-13

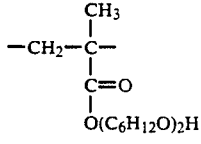 VI-14

The acrylate structural units or methacrylate structural units at the moiety having the alkyl group in the (meth-)acrylate polymers having fluorinated alkyl groups in the side chain are represented by the formula (VII) shown below.

Formula (VII):

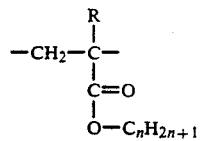

(wherein R represents hydrogen atom or methyl group, n represents an integer of 1 to 22).

The structural units represented by the formula (VII) are specifically shown below.

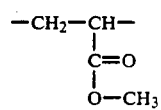 VII-1

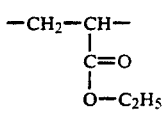 VII-2

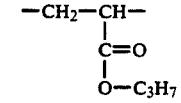 VII-3

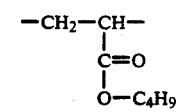 VII-4

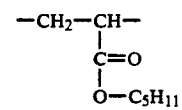 VII-5

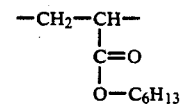 VII-6

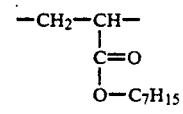 VII-7

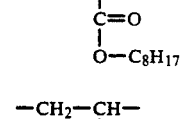 VII-8

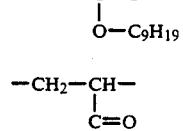 VII-9

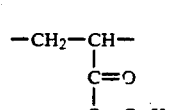 VII-10

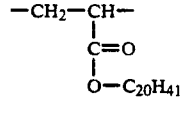 VII-11

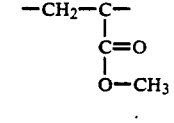 VII-12

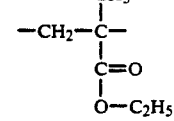 VII-13

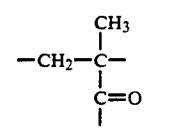 VII-14

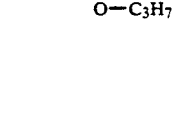 VII-15

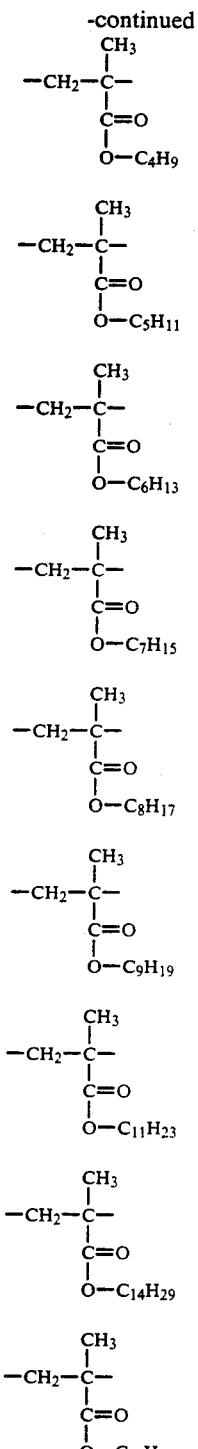

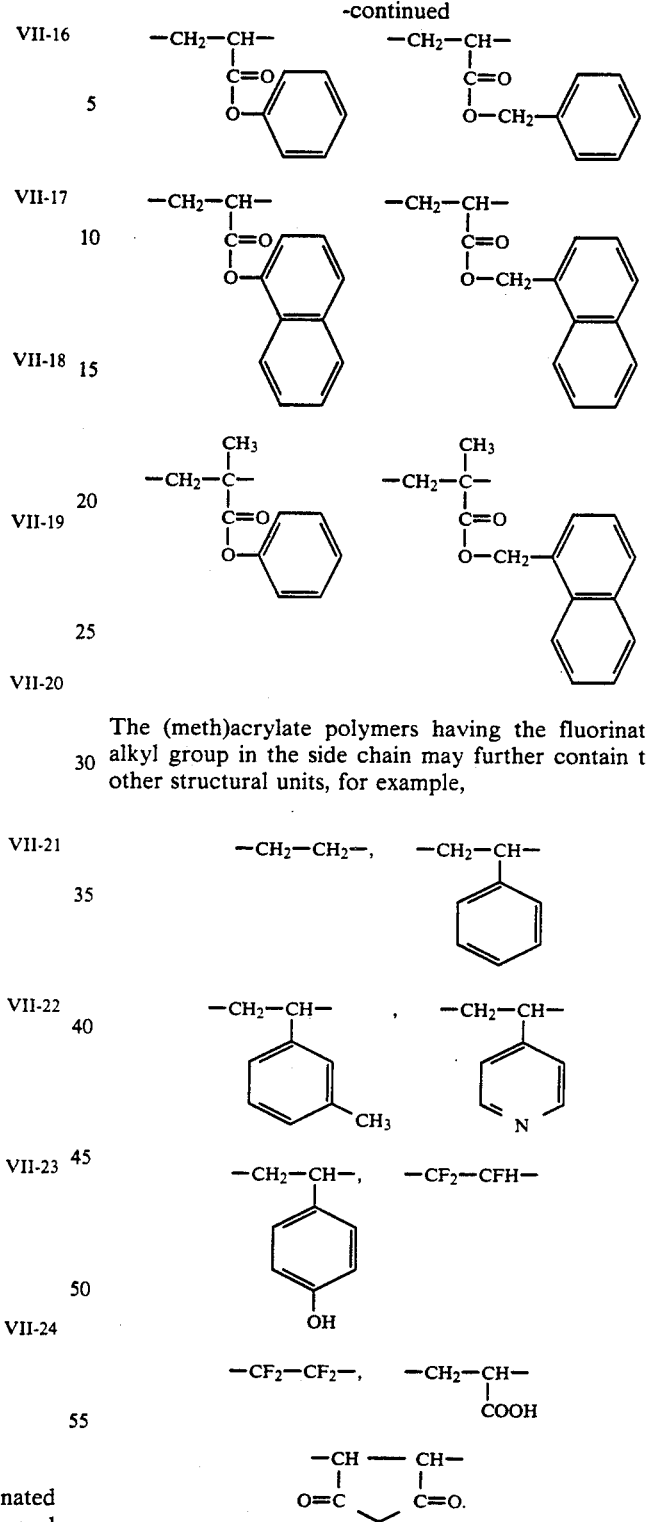

The (meth)acrylate polymers having the fluorinated alkyl group in the side chain may further contain the other structural units, for example, The (meth)acrylate polymers having the fluorinated alkyl group in the side chain may further contain an aryl group or an arylene group in the side chain. The acrylate structural units or methacrylate structural units at the moiety having the aryl group or the arylene group may include the following units.

(Meth) acrylate units:

The light-sensitive coating liquid may further contain fluorine type surfactants shown below.

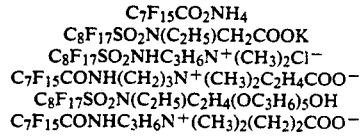

-continued $C_8F_{17}SO_2NHCH_2$—⟨benzene⟩—$SO_3Na$ $$C_6F_{13}SO_2\underset{\underset{CH_2COO^-}{|}}{N}C_3H_6N^+(CH_3)_2$$

$$C_8F_{17}SO_2\underset{\underset{C_3H_7}{|}}{N}-(CH_2)_3N^+(CH_3)_2CH_2COO^-$$

$C_8F_{17}SO_2NHC_3H_6N^+(CH_3)_2C_2H_5OS^-O_2C_2H_5$ $C_7F_{15}CONHC_3H_6N^+(CH_3)_3Cl^-$

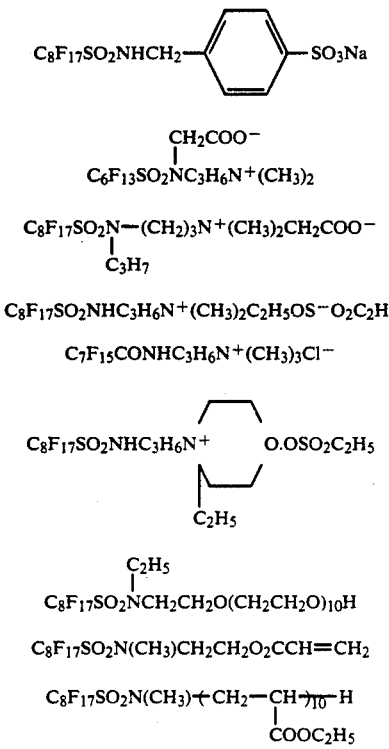

$$C_8F_{17}SO_2\underset{\underset{C_2H_5}{|}}{N}CH_2CH_2O(CH_2CH_2O)_{10}H$$

$C_8F_{17}SO_2N(CH_3)CH_2CH_2O_2CCH=CH_2$ $$C_8F_{17}SO_2N(CH_3)(CH_2-\underset{\underset{COOC_2H_5}{|}}{CH})_{10}H$$

The coating liquid obtained by dissolving in the solvent to be used in the present invention can contain either of a positive light-sensitive composition and a negative light-sensitive composition. As the positive light-sensitive composition, polymeric compounds containing o-quinonediazide group can be primarily used. Here, the polymeric compounds containing o-quinonediazide group are either one or both of the reaction product of a compound containing an o-quinonediazide group and an alkali soluble resin, and a mixture of a compound containing an o-quinondiazide group and an alkali soluble resin.

In the following, representative examples are described.

Examples of polymeric compounds containing o-quinone-diazide compounds may include ester compounds of o-naphthoquinonediazidesulfonic acid with polycondensation resins of phenols and aldehyde or ketone.

Examples of the above mentioned phenols may include monohydric phenols such as phenol, o-cresol, m-cresol, p-cresol, 3,5-xylenol, carbacrol, thymol, etc.; dihydric phenols such as catechol, resorcin, hydroquinone, etc.; trihydric phenols such as pyrrogalol, fluoroglycine, etc., and the like.

As the above-mentioned aldehyde, there may be included formaldehyde, benzaldehyde, acetaldehyde, crotonaldehyde, furfural, etc.

Among these aldehydes, preferred are formaldehyde and benzaldehyde.

Further as the above-mentioned ketone, acetone, methyl ethyl ketone and the like may be included.

Specific examples of the polycondensation resin as mentioned above may include phenol-formaldehyde resin, m-cresol-formaldehyde resin, m- and p-mixed cresol-formaldehyde resin, resorcin-benzaldehyde resin, pyrrogalol-acetone resin, etc.

The condensation ratio of o-naphthoquinonediazide sulfonic acid to the OH group of the phenols in the above-mentioned o-naphthoquinonediazide compound (reaction ratio per one OH group) may be preferably 15 to 80%, more preferably 20 to 45%.

Further, as the o-quinonediazide compound to be used in the present invention, the compounds described in Japanese Unexamined Patent Publication No. 43451/1983 can be also used.

Of the above-mentioned o-quinonediazide compounds, o-quinonediazide ester compounds obtained by reacting 1,2-benzoquinonediazidesulfonyl chloride or 1,2-naphthoquinonediazidesulfonyl chloride with a pyrrogalol-acetone condensed resin or 2,3,4-trihydroxybenzophenone are most preferred.

As the o-quinonediazide compound to be used in the present invention, the above-mentioned compound may be used each singly, or alternatively as a combination of two or more compounds.

The polymeric compound containing o-quinonediazide to be used in the present invention should preferably have a molecular weight of 1,500 or more, more preferably 2,000 or more, in view of coatability.

The o-quinonediazide compound as described above should be preferably used as a mixture with an alkali soluble resin. As the alkali soluble resin, there may be included novolac resin, vinyl polymers having phenolic hydroxyl group, condensed resins of polyhydric phenol with aldehyde or ketone disclosed in Japanese Unexamined Patent Publication No. 57841/1980, etc. Examples of the novolac resin may include phenol-formaldehyde resin, cresol-formaldehyde resin, phenol-cresol-formaldehyde co-polycondensed resin as disclosed in Japanese Unexamined Patent Publication No. 57841/1980, co-polycondensed resins of phenol and p-substituted phenol with cresol or formaldehyde as disclosed in Japanese Unexamined Patent Publication No. 12755/1980.

The vinyl polymer having phenolic hydroxyl group is a polymer containing units having said phenolic hydroxyl group in the molecular structure, preferably polymers containing at least structural unit of the formulae (VIII) to (XII) shown below.

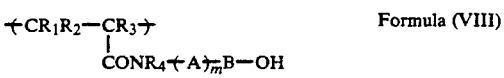

Formula (VIII)

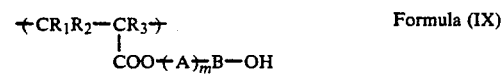

Formula (IX)

Formula (X)

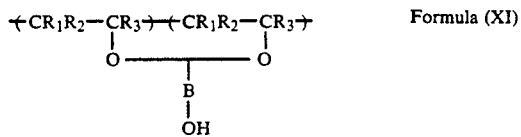

Formula (XI)

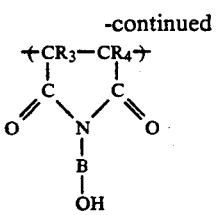

Formula (XII)

(wherein $R_1$ and $R_2$ each represent hydrogen atom, an alkyl group or a carboxyl group, preferably hydrogen atom. $R_3$ represents hydrogen atom, a halogen atom or an alkyl group, preferably hydrogen atom or an alkyl group such as methyl, ethyl, etc. $R_4$ represents hydrogen atom, an alkyl group, an aryl group or an aralkyl group, preferably hydrogen atom. A represents an alklylene group, for linking nitrogen atom or oxygen atom to an aromatic carbon atom, which may also have a substituent, m represents an integer of 0 to 10, B represents a phenylene group which may also have a substituent or a naphthylene group which may also have a substituent.

As the above-mentioned vinyl polymers to be used in the light-sensitive composition of the present invention, one having the copolymer type structure is preferred. Examples of the monomer units which can be used in combination with the structural units represented by the above formulae (VIII) to (XII) respectively may include ethylenically unsaturated olefins such as ethylene, propylene, isobutylene, butadiene, isoprene, etc.; styrene such as styrene, α-methylstyrene p-methylstyrene, p-chlorostyrene, etc.; acrylic acids such as acrylic acid, methacrylic acid, etc.; unsaturated aliphatic dicarboxylic acids such as itaconic acid, maleic acid, maleic anhydride, etc.; esters of α-methylenealiphatic monocarboxylic acids such as methyl acrylate, ethyl acrylate, n-butyl acylate, isobutyl acrylate, dodecyl acrylate, 2-chloroethyl acrylate, phenyl acrylate, methyl α-chloroacrylate, methyl methacrylate, ethyl methacrylate, ethyl ethacrylate etc.; nitriles such as acrylonitrile, methacrylonitrile, etc.; amides such as acrylamide, etc.; anilides such as acrylanilide, p-chloroacrylanilide, m-nitroacrylanilide, m-methoxyacrylanilide etc.; vinyl esters such as vinyl acetate, vinyl propionate, vinyl benzoate, vinyl butyrate, etc.; vinyl ethers such as methyl vinyl ether, ethyl vinyl ether, isobutyl vinyl ether, β-chloroethyl vinyl ether, etc.; vinyl chloride, vinylidene chloride, vinylene cyanide; ethylene derivatives such as 1-methyl-1-methoxyethylene, 1,1-dimethoxyethylene, 1,2-dimethoxyethylene, 1,1-dimethoxycarbonylethylene, 1-methyl-1-nitroethylene, etc.; N-vinyl monomers such as N-vinylpyrrole, N-vinylcarbazole, N-vinylindole, N-vinyl- pyrrolidene, N-vinylpyrrolidone, etc. These vinyl monomers exist in the polymeric compound with a structure of cleaved unsaturated double bond.

Of the above-mentioned monomers, esters of aliphatic monocarboxylic acids and nitriles exhibit excellent performances for the object of the present invention and are preferable.

Preferred as the alkale soluble resins are those having a molecular weight of 1,500 or more, more preferably 2,000 or more in view of coatability.

The negative light-sensitive substance to be used in the present invention may include various substances, but in the following representative examples thereof are described.

(1) Light-sensitive composition containing diazo resin:

Diazo resin as represented by a condensate of p-diazo-diphenylamine and formaldehyde may be either water-soluble or water-insoluble, but preferably one which is insoluble in water and soluble in conventional organic solvent as described in Japanese Patent Publications Nos. 1167/1972 and 4389/1982 may be employed. Particularly preferably, it is a diazo resin represented by the following formula (VIII):

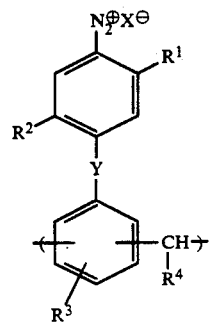

Formula (VIII)

(wherein $R_1$, $R_2$ and $R_3$ represent hydrogen atom, an alkyl group or an alkoxy group, $R_4$ represents hydrogen atom, an alkyl group or a phenyl group. X represents $PF_6$ or $BF_4$. Y represents —NH , —S— or —O—.)

The diazo resin should be preferably used as a mixture with a film forming resin which is a binder, particularly a lipophilic polymeric compound having hydroxyl group. In addition to that as mentioned above, such lipophilic polymeric compound may include copolymers of monomers having aliphatic hydroxyl group in the side chain, such as 2-hydroxyethyl acrylate or 2-hydroxyethyl methacrylate with other copolymerizable monomers, natural resins such as shellac, rosin, etc.; polyvinyl alcohol; polyamide resins as described in U.S. Pat. No. 3,751,257; linear polyurethane resins as described in U.S. Pat. No. 3,660,097; phthalated resin of polyvinyl alcohol; epoxy resins condensed from bisphenol A and epichlorohydrin; celluloses such as cellulose acetate, cellulose acetate phthalate; condensed resins of polyhydric phenols with aldehyde or keton as described in Japanese Unexamined Patent Publication No. 57841/1980; etc. Other than these, if necessary, polyvinyl butyral resins, polyurethane resins, polyamide resins, epoxy resins, novolac resins, natural resins, etc. may be also added.

Examples of the novolac resins may include phenol-formaldehyde resin, cresol-formaldehyde resin, phenol-cresol-formaldehyde co-polycondensed resins as disclosed in Japanese Unexamined Patent Publication No. 57841/1980, copolycondensed resins of p-substituted phenol with phenol, or cresol with formaldehyde as disclosed in Japanese Unexamined Patent Publication No. 127553/1980.

As the binder to be used in combination with the diazonium resin, various polymeric compounds can be used, preferably copolymers of monomers having aromatic hydroxyl group as described in Japanese Unexamined Patent Publication No. 98613/1979, such as N-(4-hydroxyphenyl)acrylamide, N-(4-hydroxyphenyl)methacrylamide, o-, m-, or p-hydroxystyrene, o-, m-, or p-hydroxyphenyl methacrylate, etc. with other monomers; polymers containing hydroxylethyl acrylate units or hydroxyethyl methacrylate units as the primary recurring units as described in U.S. Pat. No. 4,123,276.

These binders are contained in amounts of 40 to 99% by weight, preferably 50 to 95% by weight in the solids of the light-sensitive composition. The diazo resin may be contained in an amount of 1 to 60% by weight, preferably 3 to 30% by weight.

Also, in these light-sensitive composition, in addition to the above described materials, if necessary, colorants such as dyes, pigments, etc., affinitizing agents, plasticizers, surfactants, organic acids, acid anhydrides, compounds capable of generating acids by exposure, etc. can be added.

In these light-sensitive compositions, other colorants such as dyes, pigments, etc., affinitizing agents, plasticizers, surfactants, etc. can be added.

(2) Light-sensitive composition containing a polymeric compound having

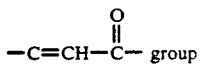

group in the main chain or side chain of the polymer:

As such polymeric compounds, those composed mainly of light-sensitive polymers such as polyesters, polyamides, polycarbonates containing

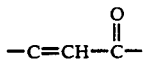

in the main chain or side chain of the polymer as the light-sensitive group (e.g. compounds as described in U.S. Pat. Nos. 3,030,208, 3,707,373 and 3,453,237); those composed mainly of light-sensitive polyesters derived from (2-propenylidene)malonic acid compounds such as cinnamylidenemalonic acid and difunctional glycols. (e.g. light-sensitive polymers as described in U.S. Pat. Nos. 2,956,878 and 3,173,787); cinnamic acid esters of hydroxyl group-containing polymers such as polyvinyl alcohol, starch, cellulose and analogues thereof (e.g. light-sensitive polymers as described in U.S. Pat. Nos. 2,690,966, 2,752,372, 2,732,301, etc.).

In these light-sensitive compositions, other sensitizers, stabilizers, plasticizers, pigments, dyes, etc. can be contained.

(3) Photopolymerizable composition comprising addition polymerizable unsaturaed compound:

This composition comprises (a) a vinyl monomer having at least two terminal vinyl groups, (b) a photopolymerization initiator and (c) a polymeric compound as a binder.

As the vinyl monomer (a), there may be employed those disclosed in Japanese Patent Publications Nos. 5093/1960, 14719/1960, 28727/1969, including acrylic acid or methacrylic acid esters of polyols, namely, diethylene glycol di(meth)acrylate, triethylene glycol di(meth)acrylate, pentaerythritol tri(meth)acrylate, trimethylolpropane tri(meth)acrylate, etc. or bis (meth)acrylamides such as methylenebis(meth)acrylamide, ethylenebis(meth)acrylamide, or unsaturated monomers containing urethane groups as exemplified by the reaction products of diolmono(meth)acrylate such as di(2'-methacryloxyethyl)-2,4-tolylenediurethane, di-(2-acryloxyethyl)trimethylenediurethane, etc. with diisocyanate.

As the photopolymerization initiator of the above component (b), the compounds represented by the above formula (VIII) can be used, but other kinds of compounds can be also used. For example, there may be included carbonyl compounds, organic sulfur compounds, persulfides, redox compounds, azo and diazo compounds, halide compounds, photoreducible dyes, etc. as described in J. Kosar "Light-sensitive systems", supra, Chapter 5. More specifically, they are disclosed in U.K. Patent No. 1,459,563.

Further, as the binder of the component (c), various known polymers can be employed. Details of specific binders are described in U.S. Pat. No. 4,072,527.

In these photopolymerizable compositions, thermal polymerization inhibitors, plasticizers, dyes, pigments, etc. can be contained.

(4) Light-sensitive composition containing azide group:

As the light-sensitive azide compound, aromatic azide compounds having azide group bonded directly or through carbonyl group or sulfonyl group to the aromatic ring may be preferably employed.

For example, there may be included polyazidostyrene, polyvinyl p-azidobenzoate, polyvinyl-p-azidobenzal as described in U.S. Pat. No. 3,096,311; reaction products of azidoarylsulfonyl chloride and unsaturated hydrocarbon polymers described in Japanese Patent Publication No. 9613/1970; polymers having sulfonylazide or carbonylazide as described in Japanese Patent Publications Nos. 21017/1968, 229/1969, 22954/1969, 24915/1970.

Added amount of additives in the light-sensitive compositions as described above, such as affinitizing agents, surfactants, sensitizers, stabilizers, polymerization inhibitors, plasticizers, dyes, pigments, etc., which may depend on the kind of the additive, may be suitably about 0.01 to 20% by weight, preferably 0.05 to 10% by weight, based on the light-sensitive composition contained in the light-sensitive coating liquid.

In the present invention, various compounds are used as the affinitizing agents, preferably resins obtained by condensing substituted phenols represented by the formula (XIV) as shown below and aldehydes, and orthonaphtoquinonediazide sulfonate of said resins.

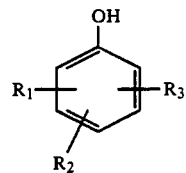

Formula (XIV)

(wherein, $R_1$ and $R_2$ represent hydrogen atom, an alkyl group or a halogen atom, $R_3$ represents an alkyl group having 2 or more carbon atoms or a cycloalkyl group).

The alkyl group represented by $R_1$ and $R_2$ of the formula (XIV) is an alkyl group of 1 to 3 carbon atoms, preferably an alkyl group of 1 to 2 carbon atoms. $R_3$ is preferably an alkyl group or a cycloalkyl group of 15 or less carbon atoms, particularly preferably an alkyl group or a cycloalkyl group of 3 to 8 carbon atoms.

The substituted phenols represented by the formula (XIV) may include, for example, isopropylphenol, t-butylphenol, t-amylphenol, hexylphenol, octylphenol, cyclohexylphenol, 3-methyl-4-chloro-5-t-butylphenol, isopropylcresol, t-butylcresol, t-amylcresol, hexylcresol, octylcresol, cyclooctylcresol, etc. Among them, particularly preferred is octylphenol and t-butylphenol.

The above-mentioned aldehydes may include, for example, aliphatic and aromatic aldehydes such as formaldehyde, benzaldehyde, acetoaldehyde, acrolein, crotonaldehyde, furfural, etc., preferably aldehydes of 1 to 7 carbon atoms, particularly preferably formaldehyde and benzaldehyde.

The resins prepared by condensing substituted phenols and aldehydes used in the present invention are obtained by polycondensing them under acidic catalysts. Further, the orthonaphtoquinonediazide sulfonate of said resins can be obtained by dissolving the above condensed resins in an appropriate solvent, pouring orthonaphtoquinonediazide sulfonic acid chloride thereto and dropping an alkali until an equivalent point with stirring to conduct esterification.

The dyes to be preferably employed in the present invention may include basic dyes and oil soluble dyes. Specifically, there may be included basic dyes such as Victoria Pure Blue BOH, Victoria Blue BH, Methyl Violet, Eisen Malachite Green (all are manufactured by Hodogaya Kagaku Kogyo), Patent Pure Blue VX, Rhodamine B, Methylene Blue (all are manufactured by Sumitomo Kagaku Kogyo), Ethyl Violet, Quinaline Red, etc.; and oil soluble dyes such as Sudan Blue II, Victoria Blue F4R (all are manufactured by B.A.S.F.), Oil Blue #603, Oil Blue BOS, Oil Blue II N (all are manufactured by Orient Kagaku Kogyo), etc.

Supports suitable for preparation of the light-sensitive printing plate by coating of the light-sensitive coating liquid of the present invention thereon may include various kinds, for example, metal plates such as aluminum, zinc, copper, steel, etc.; metal plates having chromium, zinc, copper, nickel, aluminum, etc. plated or vapor deposited thereon; papers and plastics subjected to hydrophilic treatment; papers and plastic films on which metals are provided by vapor deposition; glass plates; resin coated papers; papers plastered with metal foils of aluminum, etc. Among these, aluminum plates are preferred.

Particularly, in the case of a support of an aluminum plate, it should be preferably applied with surface treatments such as sand blasting treatment, anodic oxidation treatment and, if necessary, sealing treatment.

As the sand blasting treatment method as mentioned above, there may be employed the techniques in which the surface of an aluminum plate, etc. is deffatted, followed by application of the brush polishing method, the ball polishing method, the chemical polishing method, the electrolytic etching method, etc.

The above-mentioned anodic oxidation method may be practiced by passing current with an aluminum plate, etc. as the anode in an aqueous or non-aqueous solution mixed with one or two or more of inorganic salts of phosphoric acid, chromic acid, boric acid, sulfuric acid, etc., or organic acids such as oxalic acid, sulfamic acid, etc.

Further, the sealing treatment may be practiced by dipping in an aqueous sodium silicate solution, in hot water or a hot aqueous solution containing a small amount of an inorganic salt or organic salt, or in a steam bath.

In the present invention, the amount of the light-sensitive liquid coated onto the support may depend on the use, but generally appropriately 0.5 to 3.5 g/m$^2$ as the solid.

As the coating method of the coating liquid in the present invention, there may be employed such methods as dip coating, roll coating, reverse roll coating, air doctor coating, blade coating, rod coating, knife coating, squeeze coating, gravure coating, cast coating, curtain coating extrusion coating, etc. The coated film thickness may be preferably 0.1 to 5 g/m$^2$. The drying temperature may be in the range from 20° to 150° C., preferably from 30° to 100 ° C.

The present invention is described below by referring to Examples, but the present invention is not limited thereto.

EXAMPLE 1

A light-sensitive liquid having the composition shown below was prepared and this was coated onto a sand blasted aluminum plate by using a roll coater to a coated amount of solids 2.2 g/m$^2$, followed by drying, to obtain Sample No. 1 of a light-sensitive lithographic printing plate.

| [Light-sensitive liquid] | |
|---|---|
| Light-sensitive material QD-1 (shown below) | 2.3 wt. parts |
| Binder resin R-1 (shown below) | 6.7 wt. parts |
| 2-Trichloromethyl-5-(β-benzofuryl-vinyl)-1,3,4-oxadiazóle | 0.05 wt. part |
| Ester compound of p-octylphenol-formalin novolac resin and naphthoquinone-(1,2)-diazide-5-sulfonic acid chloride (weight average molecular weight: 2,000) | 0.05 wt. part |
| Victoria Pure Blue BOH | 0.07 wt. part |
| Diethylene glycol dimethyl ether | 24 wt. parts |
| 3-Methoxy-1-butanol | 21 wt. parts |

Next, by changing the light-sensitive material QD-1 in the above light-sensitive liquid to QD-2, QD-3 and QD-4 shown below, adding R-2 in addition to the binder resin R-1, and further changing the organic solvent, with other compositions than these three being the same as in the above light-sensitive liquid, Samples Nos. 1 to 19 were prepared as shown in Table 1. The Samples Nos. 1 to 19 thus prepared were divided into two, one of which is a group of samples coated with the light-sensitive liquid immediately after preparation of the light-sensitive liquid, and these samples were evaluated.

The other Samples Nos. 1 to 19 were placed in a closed vessel, stored at 30° C. for 7 days, and then evaluated for presence of precipitation in the light-sensitive liquid, developability, press life of the sample coated with the light-sensitive liquid.

The results of these evaluations are shown in Table 1. The conditions of development and printing are as shown below.

(Developing conditions)

Developer: An aqueous 4% sodium metasilicate solution to which 0.1% of sodium benzenesulfonate is added (containing no organic solvent);
Automatic processer: Konica PS plate automatic processer "PSK-910" (manufactured by Konica);
Developing temperature: 27° C.;
Developing time: 20 sec.

(Printing conditions)

Printing machine: Heidel GTO (manufactured by Heidelberg) Printing ink: Toyo King New Bright Kurenai (oily ink, manufactured by Toyo Ink)
Printing paper: pure paper; Printing speed: 8,000 sheets/hour.

Evaluation in Table 1 was performed as shown below.
Precipitation:
   A: none, B: slightly generated, C: generated
Staining of printing surface and dye remaining:

A: very good, B: good, C: slightly inferior, D: inferior

Compounds used as mentioned above:

QD-1: Ester compound of a pyrrogalol-acetone resin and naphthoquinone-(1,2)-diazide-5-sulfonic acid chloride (average molecular weight 2,500);

QD-2: Ester compound of a pyrrogalol-acetone resin and naphthoquinone-(1,2)-diazide-4-sulfonic acid chloride (average molecular weight 2,500);

QD-3:
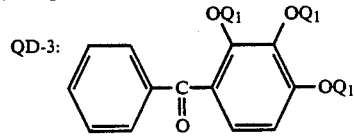

Q1: Naphthoquinone-(1,2)-diazide-5-sulfonyl group;

QD-4:
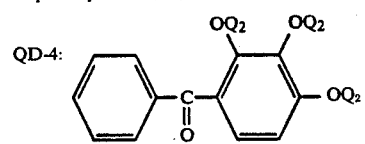

Q2: Naphthoquinone-(1,2)-diazide-4-sulfonyl group

R-1: Copolymer resin of phenol and m- and p- mixed cresol (respective molar ratio = 48:32:20) and formaldehyde (Mw = 10,000);

R-2:
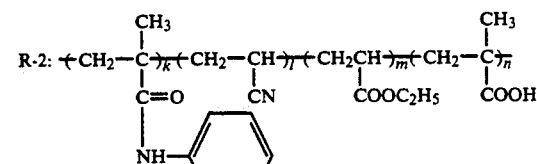

($k:l:m:n = 25:20:50:2$, Mw = 60,000).

In Table 1, 0.03 part by weight of a fluorine type surfactant "FC-430" (manufactured by 3M) was added in a part of the light-sensitive liquids.

TABLE 1

| Sample No. | Light-sensitive material (wt. parts) | Binder resin (wt. parts) | Surfactant (FC-430*) (wt. parts) | Organic solvent (wt. parts) |
|---|---|---|---|---|
| 1 | QD-1 (2.3) | R-1 (6.7) | — | DGDM* (24), 3-methoxy-1-butanol (21) |
| 2 | QD-2 (2.3) | R-1 (6.7) | — | DGDM (24), 3-methoxy-1-butanol (21) |
| 3 | QD-3 (1.5) | R-1 (7.5) | — | DGDM (24), 3-methoxy-1-butanol (21) |
| 4 | QD-4 (1.5) | R-1 (7.5) | — | DGDM (24), 3-methoxy-1-butanol (21) |
| 5 | QD-1 (2.3) | R-1 (6.7) | — | DGDM (24), 3-methoxy-3-methyl-1-butanol (21) |
| 6 | QD-3 (1.5) | R-1 (7.5) | — | DGDM (24), 3-methoxy-3-methyl-1-butanol (21) |
| 7 | QD-1 (2.3) | R-1 (6.7) | — | methyl ethyl ketone (9), 4-methoxy-1-pentanol (30), DGMM* (6) |
| 8 | QD-1 (2.3) | R-1 (6.7) | — | isopropanol (3), 5-methoxy-1-hexanol (30), DGMM (12) |
| 9 | QD-1 (2.3) | R-1 (6.7) | — | γ-butyrolactone (12), 5-methoxy-1-pentanol (24), DGMM (9) |
| 10 | QD-1 (2.3) | R-1 (3.0) R-2 (3.7) | — | DGDM (24), 3-methoxy-1-butanol (21) |
| 11 | QD-3 (1.5) | R-1 (1.2) R-2 (5.5) | — | methyl butyl ketone (4), 3-methoxy-1-butanol (36) ethylalcohol (5) |
| 12 | QD-1 (2.3) | R-1 (1.2) R-2 (5.5) | — | DGDM (21), 3-methoxy-3-methyl-1-butanol (21) DGMM (3) |
| 13 | QD-1 (2.3) | R-1 (6.7) | 0.03 | DGDM (24), 3-methoxy-1-butanol (21) |
| 14 | QD-1 (2.3) | R-1 (6.7) | 0.03 | DGDM (24), 3-methoxy-3-methyl-1-butanol (21) |
| 15 | QD-1 (2.3) | R-1 (6.7) | — | ethylene glycol monomethyl ether (45) |
| 16 | QD-1 (2.3) | R-1 (6.7) | — | propylene glycol monomethyl ether (45) |
| 17 | QD-1 (2.3) | R-1 (6.7) | — | propylene glycol monomethyl ether acetate (45) |
| 18 | QD-1 (2.3) | R-1 (6.7) | — | 3-methoxy-1-butylacetate (45) |
| 19 | QD-3 (1.5) | R-1 (1.2) R-2 (5.5) | — | 3-methoxy-1-butylacetate (45) |

| | Non-stored product | | | Evaluation after storage | | | |
|---|---|---|---|---|---|---|---|
| Sample No. | Staining of plate surface | Press life (number of printed papers) | Dye remaining | Staining of plate surface | Press life (number of printed papers) | Dye remaining | Precipitation |
| 1 | A | 100,000 | A | A | 100,000 | A | A |
| 2 | A | 100,000 | A | A | 100,000 | A | A |
| 3 | A | 100,000 | A | A | 100,000 | A | A |
| 4 | A | 100,000 | A | A | 100,000 | A | A |
| 5 | A | 100,000 | A | A | 95,000 | A | A |
| 6 | A | 100,000 | A | A | 95,000 | A | A |
| 7 | A | 100,000 | A | A | 95,000 | B | A |
| 8 | A | 100,000 | A | A | 100,000 | A | A |
| 9 | A | 100,000 | A | A | 100,000 | A | A |
| 10 | A | 150,000 | A | A | 150,000 | A | A |
| 11 | A | 210,000 | A | A | 210,000 | A | A |
| 12 | A | 180,000 | A | A | 180,000 | A | A |
| 13 | A | 100,000 | A | A | 100,000 | A | A |
| 14 | A | 100,000 | A | A | 95,000 | A | A |
| 15 | A | 100,000 | A | B | 90,000 | B | B |
| 16 | A | 100,000 | A | D | 80,000 | C | C |
| 17 | A | 90,000 | B | D | 20,000 | D | C |
| 18 | A | 90,000 | B | D | 20,000 | D | C |
| 19 | A | 160,000 | B | D | 45,000 | D | C |

Note: Sample Nos. 1 to 14 are within the present invention, and sample Nos. 15 to 19 are outside the present invention. DGDM: diethyleneglycol dimethyl ether, DGMM: diethyleneglycol monomethyl ether. FC-430 is a trade name a surfactant produced by 3M.

light- sensitive printing plate were compared to obtain the results shown in Table 2.

TABLE 2

| Sample No. | Organic solvent (wt. parts) | Non-stored product | | | Evaluation after storage | | | |
|---|---|---|---|---|---|---|---|---|
| | | Staining of plate surface | Press life (number of printed papers) | Dye remaining | Staining of plate surface | Press life (number of printed papers) | Dye remaining | Precipitation |
| 20 | DGDM (14) 3-methoxy-1-butanol (18), DGMM(13) | A | 100,000 | A | A | 100,000 | A | A |
| 21 | 3-methoxy-1-butanol (18), DGMM(9) | A | 100,000 | A | A | 100,000 | A | A |
| 22 | 4-methoxy-1-pentanol (18), methyl ethyl ketone (15), DGMM(12) | A | 100,000 | A | A | 100,000 | A | A |
| 23 | 3-methoxy-3-methyl-1-butanol (21), DGDM (14), cyclohexanone (9) | A | 100,000 | A | A | 100,000 | A | A |
| 24 | ethyleneglycol monomethyl-ether (45) | A | 100,000 | A | B | 90,000 | B | B |
| 25 | propyleneglycol monomethyl-ether (45) | A | 100,000 | A | C | 80,000 | C | C |
| 26 | propyleneglycol monomethyl-ether acetate (45) | A | 90,000 | A | D | 20,000 | D | C |
| 27 | 3-methoxy-1-butyl acetate (45) | A | 90,000 | A | D | 15,000 | D | C |

Note: Sample Nos. 20 to 23 are within the present invention, and sample Nos. 24 to 27 are outside the present invention.
DGDM: diethyleneglycol dimethyl ether, DGMM: diethyleneglycol monomethyl ether.

As is apparent from Table 1, for non-stored products, both of the products of the present invention and the products outside of the present invention can be said to be relatively good. However, as to evaluation after storage, for contamination of printing plate, dye remaining and precipitation, in the present invention, it can be evaluated as substantially A, while in those outside the present invention, the evaluation is not only substantially C to D, but also press life is inferior.

EXAMPLE 2

A light-sensitive liquid having the composition shown below was prepared, and this was coated onto a sand blasted aluminum plate by use of a roll coater to a coated amount of 1.6 g/m² solids, followed by drying to obtain Sample No. 20 of a light-sensitive lithographic printing plate.

| [Light-sensitive liquid] | |
|---|---|
| Copolymer obtained according to the method shown in synthesis example 1 in Japanese Unexamined Patent Publication No. 7045/1987 from the starting materials of N-(4-hydroxy-phenyl:methyacrylamide:acrylonitrile:ethyl acrylate:methacrylic acid:n-butyl acrylate = 8:32:40:10:10 in terms of monomer molar ratios charged (average molecular weight 55,000) | 6.0 wt. parts |
| Hexafluorophosphoric acid salt of a condensed resin of p-diazophenylamine and p-formaldehyde (molar ratio 1:0.9) (average molecular weight 2,400) | 0.48 wt. part |
| Julimer AC-10 L (manufactured by Nippon Kayaku) | 0.36 wt. parts |
| Victoria Pure Blue BOH | 0.09 wt. part |
| Diethylene glycol dimethyl ether | 24 wt. parts |
| 3-Methoxy-1-butanol | 21 wt. parts |

Light-sensitive liquid Samples Nos. 21 to 27 were prepared in the same manner as Sample No. 20 except for replacing the organic solvent composition in the light-sensitive liquid with the compounds shown in Table 2.

For the Samples Nos. 21 to 27 thus obtained, presence of the precipitate before and after storage of the light-sensitive liquid, and developability and press life of the As is apparent from Table 2, in evaluation after storage, according to the present invention, staining of the printing plate, dye remaining and precipitation are evaluated as A, while outside of the present invention, not only evaluation is substantially C to D, but also press life is inferior.

The present invention, by use of substances represented by the formulae (I) to (III) as the solvent of the light-sensitive coating liquid, can obtain a light-sensitive coating liquid which is improved in odor, low in toxicity and yet excellent in storability of the light-sensitive coating liquid.

Also, there can be obtained a light-sensitive coating liquid which is suitable for preparation of a light-sensitive lithographic printing plate which is good in plate layout proof property and also without staining due to absence of dye remaining, and also improved in press life.

We claim:

1. A light-sensitive coating liquid with improved storability comprising:
   a light-sensitive composition selected from the group consisting of a positive light-sensitive composition containing an o-quinonediazide compound and a negative light-sensitive substance containing a diazo resin;
   a dye;
   3-methoxy-1-butanol as an organic solvent; and
   at least one solvent selected from the group consisting of diethylene glycol monomethyl ether and diethylene glycol dimethyl ether.

2. The light-sensitive coating liquid according to claim 1, wherein said another solvent is diethylene glycol dimethyl ether present at a ratio of 30% by weight to 60% by weight based on the total amount of the solvents.

3. The light-sensitive coating liquid according to claim 1, further comprising a fluorine type surfactant.

4. The light-sensitive coating liquid according to claim 3, wherein the fluorine type surfactant is a methacrylate or acrylate polymer having fluorinated alkyl group in the side chain.

5. The light-sensitive coating liquid according to claim 4, wherein the methacrylate or acrylate polymer has a number average molecular weight calculated on the standard polystyrene in the range of 30,000 or less.

6. The light-sensitive coating liquid according to claim 4, wherein the acrylate structural unit or the methacrylate structural unit at the moiety having the fluorinated alkyl group in the side chain of the methacrylate or acrylate polymer is a compound represented by the the formula (IV) or the formula (V) shown below: Formula (IV)

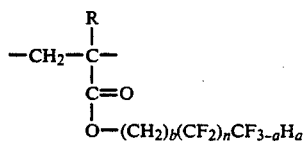

wherein R is hydrogen atom or methyl group, n represents an integer of 0 to 20, a 0 to 2 and b 0 to 1, Formula (V)

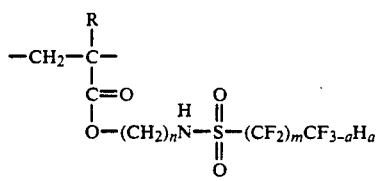

wherein R is hydrogen atom or methyl group, n represents an integer of 0 to 10, m 0 to 20 and a 0 to 2.

7. The light-sensitive coating liquid according to claim 4, wherein the (meth)acrylate polymers having the fluorinated alkyl group in the side chain has further an alkylene oxide group or an alkyl group in the side chain, and has the structural formula represented by the formula (VI) or (VII) shown below: Formula (VI):

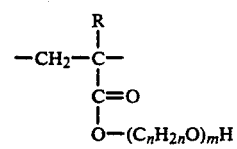

wherein R represents hydrogen atom or methyl group, n represents an integer of 1 to 6 and m 1 to 10, Formula (VII):

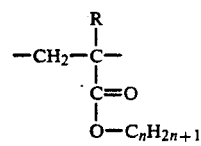

wherein R represents hydrogen atom or methyl group and n represents an integer of 1 to 22.

8. The light-sensitive coating liquid according to claim 3, wherein the fluorine type surfactant is contained in an amount of 0.02 to 0.2% by weight based on the solids contained in the light-sensitive coating liquid.

9. The light-sensitive coating liquid according to claim 3, wherein the fluorine type surfactant is contained in an amount of 0.025 to 0.1% by weight based on the solids contained in the light-sensitive coating liquid.

* * * * *